United States Patent [19]
van de Goor et al.

[11] Patent Number: 5,513,318
[45] Date of Patent: Apr. 30, 1996

[54] METHOD FOR BUILT-IN SELF-TESTING OF RING-ADDRESS FIFOS

[75] Inventors: Ad J. van de Goor, CA Gouda, Netherlands; Yervant Zorian, Princeton, N.J.

[73] Assignee: AT&T Corp., Murray Hill, N.J.

[21] Appl. No.: 365,394

[22] Filed: Dec. 28, 1994

[51] Int. Cl.[6] .................................................. G06F 11/00
[52] U.S. Cl. ........................ 395/185.01; 395/185.06; 395/185.07; 395/183.18
[58] Field of Search .................. 395/181, 182.03, 395/183.01, 183.03, 183.18, 183.19, 183.20, 183.22, 184.01, 185.01, 185.06, 185.07

[56] References Cited

U.S. PATENT DOCUMENTS

| | | | |
|---|---|---|---|
| 4,779,234 | 10/1988 | Kaneko et al. | 365/221 |
| 4,875,196 | 10/1989 | Spaderna et al. | 365/238 |
| 4,953,101 | 8/1990 | Kelleher et al. | 364/518 |
| 4,995,040 | 2/1991 | Best et al. | 371/36 |
| 5,083,269 | 1/1992 | Syobatake et al. | 395/425 |
| 5,267,206 | 11/1993 | Koyabu | 365/201 |
| 5,394,399 | 2/1995 | Kawasaki et al. | 370/84 |
| 5,420,984 | 5/1995 | Good et al. | 395/275 |

OTHER PUBLICATIONS

Y. Zorian, A. J. van de Goor, and I. Schanstra, *Proceedings, IEEE International Test Conference*, Washington DC, Oct. 1994, pp. 378–387.

Y. Zorian, A. J. van de Goor, and I. Schanstra, Presentation, *IEEE International Test Conference*, Washington DC, Oct. 1994

*Primary Examiner*—Hoa T. Nguyen
*Attorney, Agent, or Firm*—Robert B. Levy

[57] ABSTRACT

A dual-port, RAM-type ring-address FIFO (100) is tested by causing the FIFO to execute a composite test method comprised of set of interwoven steps (( 1 )–(31 ) or (1')–(25')). Upon execution, the steps of the composite method cause the FIFO (100) to manifest all possible memory, address and functional faults. The test method manifests faults by causing the FIFO (100) to alter the state of the various flags it normally sets and by altering the logic state of the data normally produced by the FIFO.

12 Claims, 4 Drawing Sheets

FIG. 3

| # | OPERATION $O(1)$ | $O(n)$ | $O(n^2)$ | | FF | EF | DETECTED FAULTS |
|---|---|---|---|---|---|---|---|
| 1 | RS | | | | 0 | 1 | |
| 2 | RCK ‖ RE=1 | | | | 0 | 1 | ORP, RAck |
| 3 | WCK ‖ WE=0 | | | | 0 | 1 | WE, WAck |
| 4 | w0 | | | | 0 | 0 | WAck |
| 5 | RCK ‖ RE=1 | | | | 0 | 0 | RE, RAck |
| 6 | r0 | | | | 0 | 1 | WO→RO RAck |
| 7 | RT | | | | 0 | 0 | RT |
| 8 | RS | | | | 0 | 1 | |
| 9 | TA⇑ 1n−1 | ⇑₀ TA−1 | w | | 0 | 0 | |
| 10 | | | r | | 0 | 1 | |
| 11 | | RS | | | 0 | 1 | |
| 12 | | ⇑₀ n−2 | w | | 0 | 0 | RS |
| 13 | | RS | | | 0 | 1 | |
| 14 | ⇒₀ logB | ⇑₀ n−1 | w0 | | 0 | 0 | EF |
| 15 | | | r0 | | 0 | 1 | EF |
| 16 | | RT | | | | | |
| 17 | | ⇑₀ n−1 | r0 ‖ DI:=1 | | 0 | 0 | MPF, EF, SAF |
| 18 | | | w1 | | 1 | 0 | FF, AF-IV |
| 19 | | ⇑₀ n−1 | r1 ‖ DI:=0 | | 0 | 0 | MPF |
| 20 | | | w0 | | 1 | 0 | AF-IV |
| 21 | | ⇑₀ n−2 | r0 | | 0 | 0 | TF, AF-II, SAF |
| 22 | | r0 | | | 0 | 1 | |
| 23 | ⇑₀ n−2 | w0 ‖ 1 | | | 0 | 0 | AF-II |
| 24 | w1 | | | | 1 | 0 | AF-I |
| 25 | WCK ‖ WE+1 | | | | 1 | 0 | OWP, WAck |
| 26 | Del | | | | 1 | 0 | |
| 27 | ⇑₀ n−1 | r0 ‖ 1 | | | 0 | 0 | DRF, SOF |
| 28 | | w1 ‖ 0 | | | 1 | 0 | |
| 29 | Del | | | | 1 | 0 | |
| 30 | ⇑₀ n−2 | r1 ‖ 0 | | | 0 | 0 | DRF, SOF |
| 31 | r0 | | | | 0 | 1 | DRF, SOF |

FIG. 5

| # | OPERATION O(1) | O(n) | FF | EF | DETECTED FAULTS |
|---|---|---|---|---|---|
| 1' | RS | | 0 | 1 | |
| 2' | RCK ‖ RE=1 | | 0 | 1 | ORP, RAck |
| 3' | WCK ‖ WE=0 | | 0 | 1 | WE, WAck |
| 4' | w0 | | 0 | 0 | WAck |
| 5' | RCK ‖ RE=1 | | 0 | 0 | RE, RAck |
| 6' | r0 | | 0 | 1 | WO→RO, RAck |
| 7' | RT | | 0 | 0 | RT |
| 8' | ⇑₀ n-1 | SLO | | | |
| 9' | RS | | 0 | 1 | RS |
| 10' | ⇑₀ n-1 | w0 | 0 | 0 | EF |
| 11' | | r0 | 0 | 1 | EF |
| 12' | RT | | | | |
| 13' | ⇑₀ n-1 | r0 ‖ DI:=1, wi1, wi0, w1 | 1 | 0 | SAF, MPF, RI, WI, LF |
| 14' | ⇑₀ n-1 | ri1, wi0, r0, w1 | 1 | 0 | FF, AF-IV, TF, RI, WI, SOF, SAF |
| 15' | ⇑₀ n-1 | r1 ‖ DI:=0, wi0, wi1, w0 | 1 | 0 | SAF, MPF, LF, AF-I |
| 16' | ⇑₀ n-1 | ri0, wi1, r1, w0 | 1 | 0 | FF, AF-IV, TF, AF-I, SOF, SAF |
| 17' | ⇒₀ B-1 | wi0←, ri0← | | | PSCF |
| 18' | ⇒₀ B-1 | wi2←, ri1← | | | PSCF |
| 19' | WCK ‖ WE=1 | | 1 | 0 | OWP, WAck |
| 20' | DEL | | 1 | 0 | |
| 21' | ⇑₀ n-1 | r0 | 0 | 1 | DRF, AFII |
| 22' | ⇑₀ n-2 | w1 | 0 | 0 | AF-II |
| 23' | w1 | | 1 | 0 | |
| 24' | DEL | | 1 | 0 | |
| 25' | ⇑₀ n-1 | r1 | 1 | 0 | DRF |

METHOD FOR BUILT-IN SELF-TESTING OF RING-ADDRESS FIFOS

TECHNICAL FIELD

This invention relates to a technique for accomplishing Built-In Self-Testing of a ring-address FIFO to detect memory faults, addressing faults and functional faults.

Background Art

First-In First-Out memories (FIFOs) are used in a variety of electronic circuits for buffering data transferred between a pair of circuits that operate at different clock rates. Generally, there are two types of FIFOs. The first type of FIFO is the shift register type that uses a self-clocking register for shifting data from a write port to a read port. The second type of FIFO utilizes a Random Access Memory (RAM) as its storage element, rather than a shift register. The RAM within the RAM-type FIFO may have a single (combined) read/write port or separate (dual) ports for reading and writing data, the latter being more popular. The most common type of dual-port RAM-type FIFO utilizes a ring-type addressing mechanism comprised of a pair of n-bit shift registers (where n is an integer, corresponding to the number of storage rows in the RAM). Each shift register is associated with one of the read and write ports, respectively, of the RAM and operates to sequentially address the RAM so that a B-bit word may be read from, or written to the addressed storage location, respectively.

From a reliability standpoint, it is desirable to test all aspects of the ting-address FIFO. In the past, FIFOs have been tested by parametric, functional and asynchronous tests. However, such tests do not reliably detect all possible faults, including faults associated with the memory, the addressing mechanism, and the overall functionality of the FIFO. While fault models and tests have been described in the literature for detecting faults in RAMs, no fault-model tests have been described for testing the dual-port ring-address FIFO.

Thus, there is a need for a technique to detect memory, address and functional faults that may occur in a dual-port RAM-type ring address FIFO.

Brief Summary of the Invention

Briefly, in accordance with the invention, a method is provided for testing a dual-port RAM-type ring-address FIFO to detect memory, address and functional faults. The method is practiced by causing the FIFO to execute a first sequence of operations, including a first set of functional operations. The first sequence of operations, when executed, causes the FIFO to manifest certain functional faults when present. Following the first operation sequence, the FIFO executes a second sequence of operations. The second sequence of operations, when executed, detects a second set of functional faults, including faults associated with the re-transmit and reset function of the FIFO. Next, the FIFO executes a third sequence of operations. The third sequence of operations detects a third set of functional faults, a first set of memory faults, and a first set of address faults. The fourth sequence of operations detects a second set of addressing faults and a second set of memory faults. The first and second sets of addressing faults comprise the entire set of potential addressing faults while the first and second sets of memory faults comprise all of the potential memory faults. By executing the first, second, third and fourth sequences of operations, all of the potential memory, address and functional faults of the FIFO are detected.

BRIEF DESCRIPTION OF THE DRAWINGS

FIG. 3 is a table illustrating the steps of a method, in accordance with a first embodiment of the invention, for testing the FIFO of FIG. 1;

FIG. 5 is a table illustrating the steps of a method in accordance with a second embodiment of the invention for testing the FIFO of FIG. 4.

DETAILED DESCRIPTION

Figure 1:
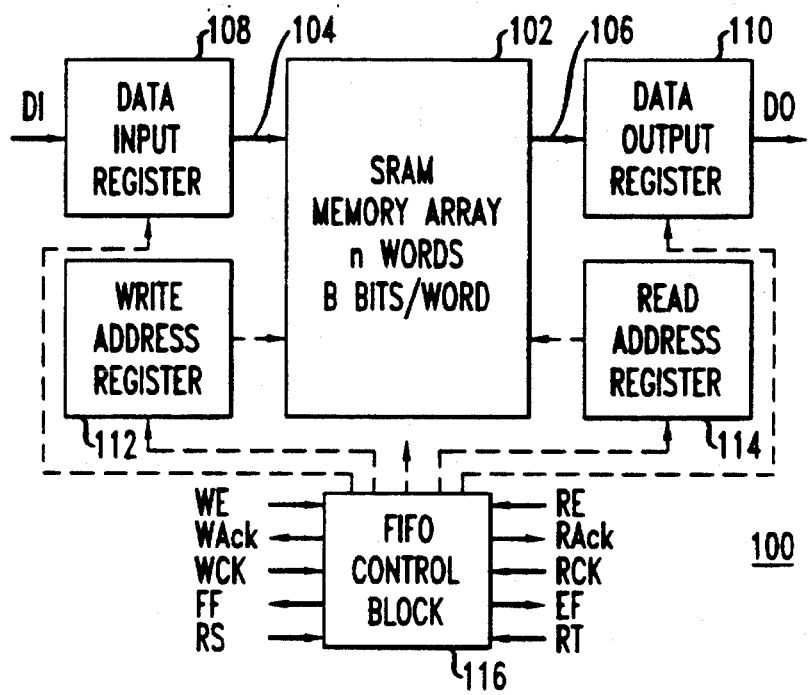
FIG. 1 is a block schematic diagram of a prior-art ting-address FIFO having a dual-port RAM as its memory element.

FIG. 1 illustrates a prior-art, dual-port RAM-type ring-address, First-In First-Out (FIFO) memory device 100 comprised of a Random Access Memory (RAM) 102 that has n storage rows (where n is an integer), each row storing a word B bits wide (where B is also an integer). The RAM 102 has separate input and output ports 104 and 106, respectively, through which data is written to, and read from, respectively, the RAM. The input port 104 of the RAM 102 is coupled to a data input register 108 that acts as a buffer to temporarily store incoming data supplied on a Data Input (DI) line before such data is supplied to the RAM input port. The RAM output port 106 is coupled to a data output register 110 that buffers outgoing data from the RAM 102 before such data is placed on a Data Output (DO) line.

Figure 2:
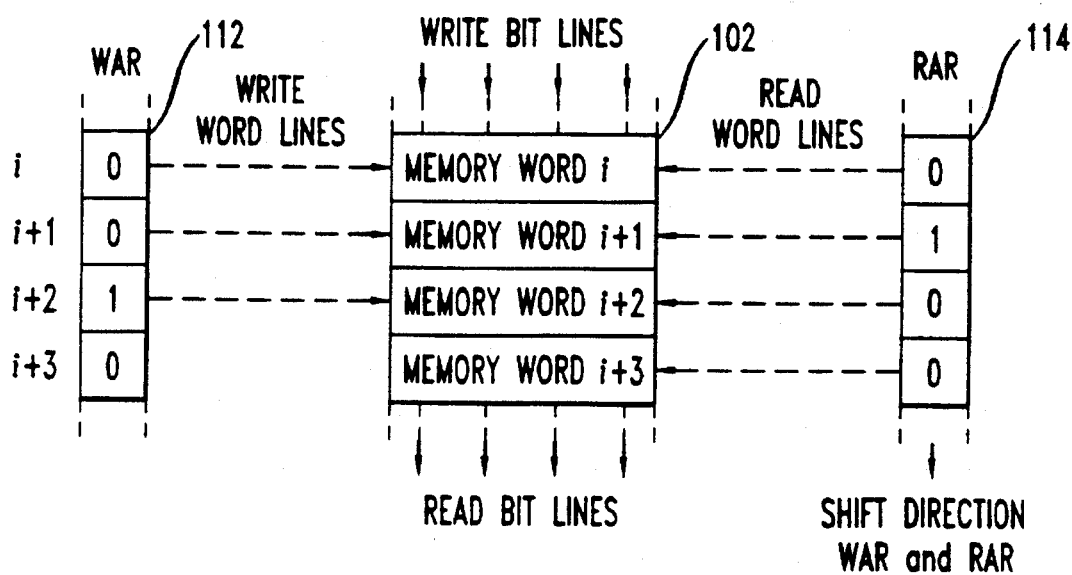
FIG. 2 is a block schematic diagram of a portion of the FIFO of FIG. 1 showing the manner in which the RAM is addressed.

The FIFO 100 further includes a Write Address Register (WAR) 112 and a Read Address Register (RAR) 114, each n bits wide. Referring to FIG. 2, both the WAR 112 and the RAR 114 contain a pattern of n-1 "0s" and a single "1". The position of the "1" in the pattern stored in the WAR 112 and in the RAR 114 corresponds to the particular word in the RAM 102 addressed by the WAR and RAR, respectively. For example, when a "1" is present in the i+2 position of the WAR 112, then the WAR addresses the i+2 word in the RAM 102.

Referring to FIG. 1, the FIFO 100 also includes a control block 116, typically a state machine, for controlling the operation of the FIFO in response to a set of externally-supplied signals. The externally supplied signals include a Write Enable (WE) and a Read Enable (RE) signal for controlling the WAR 112 and RAR 114, respectively. When the WE and RE signals are asserted at a logic "1" level, the control block 116 causes the WAR 112 and RAR 114, respectively, to be incremented to address the next successive location in the RAM 102 that is to be written to, and read from, respectively. A Write Clock (WCK) signal and a Read Clock (RCK) signal are also input to the control block 116 to cause the control block to clock the data input register 108 and the data output register 110, respectively, to write data to, and to read data from, respectively, the RAM 102. The control block 116 is also responsive to externally supplied Reset (RS) and Re-Transmit (RT) signals. Upon receipt of the RS signal, the control block 116 brings the FIFO 100 to its initial state by resetting the WAR 112 and the RAR 114 so both registers address the first word of the RAM 102, stored at an Initial Address (IA) of 1,0,0 . . . . 0. Upon receipt of the RT signal, the control block 116 resets the RAR 114 so that the RAR now addresses the first word of the RAM 102.

The control block 116 not only controls the operation of the FIFO 100 but also generates certain signals (flags) indicative of the operation of the FIFO. For example, the FIFO generates a Full FIFO (FF) flag and an Empty FIFO (EF) flag. The FF flag is set to a logic high or "1" level when the RAM 102 is full (i.e., the RAM contains n unread words). Conversely, the FF flag is set to logic low or "0" level when the FIFO 100 is not full (i.e., one or more of the n words in the FIFO 100 has been read.) The EF flag is set to a logic high or "1" level when the FIFO 100 contains zero words (i.e., all of n words in the RAM 102 have been read.) The EF flag is set to a logic low or "0" level when the FIFO 100 is not empty. Typically, the control block 116 utilizes the status of the FF and EF flags to afford the FIFO 100 Over-Write Protection (OWP) and Over-Read Protection (ORP), respectively. When the FF flag is at a logic high or "1" level, then the control block 116 prevents the occurrence of a Write Operation (WO) while allowing such an operation when FF=0. In a similar fashion, the control block 116 prevents the occurrence of a Read Operation (RO) when the EF flag is at a logic high or "1" level while permitting a RO when EF=0. In addition to the flags FF and EF, the control block 116 generates a Write Acknowledge (WAck) flag and a Read Acknowledge (RAck) flag when a WO and a RO, respectively, have occurred. The FIFO 100 may experience a variety of faults. For instance, the FIFO 100 may experience memory faults associated with the RAM 102. Such memory faults may include:

1. a Stuck-At Fault (SAF) characterized by the presence of a logic "1" or "0" in a memory location in the RAM 102 notwithstanding the fact that a "0" or a "1", respectively, had been previously written to that location;
2. a Stuck-Open Fault (SOF) characterized by an open read or write line to each storage location so that the value read from the RAM corresponds to a previously written value rather than its current value;
3. a Transition Fault (TF) characterized by the failure of the value of a bit stored in the RAM 102 to transition from a logic "1" to a logic "0" (or vice versa) following a pair of WOs during which a logic "1" and a logic "0", respectively, (or a logic "0" and logic "1 ", respectively,) were written;
4. Coupling faults (CFin, CFid and CFst) characterized by inversion, indepotent and state coupling, respectively, of a bit stored in the RAM 102;
5. a Data Retention Fault (DRF) characterized by the loss of a data value stored in a memory bit in the RAM 102 over time;
6. Linked Coupling Faults, characterized by the simultaneous occurrence of two coupling faults and Linked Transition and Coupling Faults, characterized by the simultaneous presence of a linked fault and a coupling fault, (these two types of faults collectively identified by the term (LF)); and
7. Multi-Port Faults (MPF) characterized by faults associated with the mechanism within each storage location that allows for accessing via multiple input and output ports.

In addition to the above-described memory faults, the FIFO 100 may also experience a fault in addressing the words stored in the RAM 102. Such faults, hereinafter referred to as Address Faults (AF), can be classified in four categories:

1. AF-I The address faults in category I manifest themselves when, after at most n increments, the contents in either the WAR 112 or the RAR 114 remains all "0s";.
2. AF-II The address faults in category II manifest themselves when, after at most n-1 increments, the contents of the WAR 112 or RAR 114 contains more than a single "1";
3. AF-III The address faults in category III manifest themselves by all "0s" rather than one or two specific addresses; and
4. AF-IV The address hulls in category IV manifest themselves by two separate addresses.

Lastly, the FIFO 100 may also experience functional faults as a result of an inability to perform one or more of its above-described functions and/or an inability to generate proper values for the flags FF, EF, WAck and RAck. The FIFO 100 is also deemed to be faulty if the FIFO is able to perform a WO and a RO when the FIFO is full and empty, respectively.

In accordance with the invention, a method has been provided for testing the FIFO 100 to detect potential memory faults, address faults, and functional faults by causing the FIFO to execute several sequences of functional operations, read operations and write operations. The steps of the method are illustrated in tabular form in FIG. 3. As seen in that figure, the method comprises thirty-one separate steps, labeled (1)–(31) that have been grouped in four sequences I–IV.

Prior to actually initiating testing, the FIFO 100 of FIG. 1 is cleared so that the flags FF and EF are at a logic low or "0" level and a logic high or "1" level, respectively. The first operation sequence is commenced by executing Step (1), whereupon a Reset (RS) operation is initiated to cause the FIFO 100 to be reset so that the WAR 112 and the RAR 114 (both of FIG. 1) each address the IA, thereby addressing the first word in the RAM 102 of FIG. 1. Next, step (2) of FIG. 3 is executed and an active (i.e., a logic "1" or high level) Read Clock (RCK) signal and an active Read Enable (RE) signal are supplied to the control block 116 of FIG. 1 to cause the RAM 102 to commence a Read Operation (RO). If the FIFO 100 is operating properly, then the RO should fail because of the Over-Read Protection (ORP) feature of the FIFO. If the Read Acknowledge (RAck) flag is set, then a fault exists with either the flag itself, or with the ORP feature of the FIFO 100.

Step (3) is executed after step (2),whereupon an active Write Clock signal (WCK) and an inactive (logic low or "0" level) Write Enable signal (WE) are supplied to the control block 116 of FIG. 1. Even though the WCK signal is active, the RAM 102 of FIG. 2, unless faulty, should not commence a WO while the signal WE is inactive. Therefore, the Write Acknowledge flag (WAck) should not be set at this time. Thus, by monitoring the WAck flag, a fault associated with that flag and/or with the WE signal, can be detected during step (3).

After step (3), step (4) is executed, whereupon a WO is commenced to write a word of all zeros in the first storage location in the RAM 102 of FIG. 2. (The WO is commenced upon the assertion of an active WCK signal and an active WE signal.) Upon execution of the WO during step (4), the flag WAck should now be set to indicate that a WO did indeed occur. Moreover, the Empty FIFO flag (EF) should no longer be set because the FIFO 100 should no longer be empty if the WO was executed successfully. After step (4), step (5) is executed, whereupon an active Read Clock (RCK) signal and an inactive Read Enable (RE) signal are supplied to the control block 116 of FIG. 1. While the RE signal is inactive, the control block 116 should not initiate a RO unless there is a fault. Thus, the Read Acknowledge (RAck) flag should not be set at this time. If the RAck flag has been set, then either the flag itself is faulty, and/or there is some fault associated with the RE signal.

Following step (5), step (6) is executed and a RO is executed to determine if a word of all "0s" has been written at the first location of the RAM 102 during the previous WO. (The RO during step (6) is commenced by asserting an active RCK signal and an active RE signal.) If the RO has been successfully executed during step (6), the RAck flag should now be set. Further, if the RO has been successfully executed, then the Empty FIFO (EF) flag should also be set because the FIFO 100 of FIG. 1 should now be empty (i.e., all of the words previously written in the RAM 102 of FIG. 1 have now been read). A failure of the RAck flag to be set during step (6) indicates a fault associated with that flag and/or a fault associated with an inability to successfully execute a write operation and a successive read operation.

As may now be appreciated, steps (1)–(6), comprising the first sequence of operations, serve to detect a first set of functional FIFO faults associated with the ORP, WE and RE functions, as well as faults associated with the RAck and WAck flags.

Steps (7)–(13) comprise a second sequence of operations. This second sequence is executed to detect faults associated with the Re-Transmit (RT) and Reset (RS) functions of the FIFO 100 of FIG. 1. The RS operation performs two separate functions. First, the RS operation resets both the WAR 112 and WAR so each address the first (i.e., the $0^{th}$) row of storage locations in the RAM 102. Also, to avoid a potential conflict when both the WAR 112 and RAR 112 were reset from the contents location other than the initial location, the RS operation must also reset an internal FIFO register (not shown), referred as the Last Operation (LO)register, to indicate that the last operation executed was a RO. If LO register was not reset to indicate a RO occurred following a reset operation, then when WAR 112 and RAR 114 were reset from same content location, it would not be possible to tell if the FIFO 100 was full or empty. Thus, to successfully reset the FIFO 100, the RS function has to initialize the Last Operation (LO) executed by the FIFO 100 to a RO. This aspect of the RS function may be tested by setting the LO to a WO and then performing a RS operation. If the LO register is not reset to indicate that the last operation was a RO, then the RS operation was faulty.

Also, the RS operation must set the WAR 112 and the RAR 114 of FIGS. 1 and 2 to the IA of 1,0 . . . . 0 regardless of the previous contents of each register. The ability of the control block 116 to reset the WAR 112 and the RAR 114 has to be tested for every address in the WAR and RAR (not necessarily for every combination) because one or more registers (ring address cells) in the WAR and RAR may have a reset input that may malfunction. Such a malfunction could cause a reset from an address such that the WAR 112 or RAR 114 might contain an address having two "1 s" rather than a single "1".

To determine if the both the WAR 112 and RAR 114 can be correctly reset, a RS operation is executed from successive addresses in the WAR and in the RAR. For ease of discussion, each successive address (i.e., each successive cell in the WAR 112 and RAR 114) from which an RS operation is commenced will be referred to as a Test Address (TA). When the RS operation is successful, both the WAR 112 and the RAR 114 should contain an address of 1, 0, 0 . . . . 0, indicating that both the RAR and WAR now address the IA (i.e., the first word in the RAM 102). Thus, the problem is to detect the presence of a "1" at the TA of the WAR 112 or the RAR 114 following the RS.

A RS fault associated with the WAR 112 or with the RAR 114 can be detected by shifting the WAR by performing a plurality of write operations. The fault (RAR)[TA])=1 (signifying a one at the test address TA) will be detected after TA successive WOs by the condition FF=1. By the same token, the fault (WAR[TA])=1 will be detected after n-TA successive WOs by FF=1. As will become better understood from an explanation of the operations performed during steps (7)–(13), the RS function is evaluated by performing TA successive ROs and WOs followed by an RS operation. If thereafter, the FF flag is set to a logic "1" or high level, then a RS fault has occurred.

The RT operation, which causes the RAR 114 to be reset to the IA, may fail for only a single read address. Assuming that the RS and RT operations are initiated by the same circuitry (not shown) with the control block 116 of FIG. 1, the RT only has to be tested for a single read address unequal to the TA, in addition to RS operation, for every read address to detect a fault in the RAR 114.

Referring to FIG. 3, testing of the RS and RT operations is commenced upon the execution of step (7), whereupon the control block 116 of FIG. 1 causes the FIFO 100 to commence a RT operation. Following the RT operation, the RAR 114 should be reset to the IA to address the first word in the RAM 102. Previously, this word had been read during step (6) so that the EF flag is now set to a logic high or "1" level, signifying that all of the words previously written in the FIFO 100 of FIG. 1 have now been read. However, once the RT operation is commenced during step (7), the RAR 114 of FIG. 1 once again addresses the first word in the FIFO 100 that is assumed to be unread. As a consequence, the EF flag is now zero as is the FF flag.

Following step (7), step (8) is executed and a RS operation is commenced to reset both the WAR 112 and RAR 114 to the IA to address the first word in the RAM 102. Upon execution of the RS operation, the Last Operation (LO) is remembered in order to determine the status of the EF and FF flags. Since LO=RO following step (6), the EF flag should be a logic "1" or high level since the last written word has been read. The FF flag remains at a logic "0" or low level because the FIFO 100 has not yet been completely written with data.

After step (8), step (9) is executed TA-1 times, whereupon a write operation (WO) is commenced upon each execution of step (9) to successively write values in the RAM 102, beginning from the address TA-1. After each execution of step (9), step (10) is executed to perform a RO to read the value at the same address that was written to during the previous WO executed during step (9). Thus, like step (9), step (10) is executed TA-1 times. Once a WO and a RO operation have been executed TA-1 times in succession, step (11) is executed and a RS operation is commenced. If, upon execution of the RS operation during step (11), the FF flag is found to be a logic "1", then an RS fault has occurred. At this time, the RAM 102 should be empty because every address to which a value had been written during step (9) should have been read during step (10).

To completely test the RS function, it is necessary to determine if a logic high level or "1" appears at the TA of the WAR 112 or RAR 114. For this reason, following step (11), step (12) is executed n-1 times whereupon a WO is commenced during each execution of step (12) to successively write values into the RAM 102, commencing from the initial location to the n-$1^{th}$ location. Following the last execution of step (12), a RS operation is commenced during step (13). If, after the RS operation is executed during step (13), the FF flag is found to be a logic "1" or high level, then an RS fault has occurred. This is because the RAM 102 should not be completely full at this time.

Following step (13), steps (14)–(22), constituting a third sequence of operations, are executed. As will be discussed, the third sequence of operations tests the EF and FF flags, the type II and type IV address faults, Stuck-at Faults (SAFs), Transition Faults (TFs), state Coupling Faults (CFsts), inversion Coupling Faults (CFins) and Multi-Port Faults (MPFs). The two step of the third operation sequence are steps (14) and (15) which are is executed in sequence n times immediately after step (13). During each execution of step (14), a WO is commended to write a word of all zeros into a successive one of n locations in the RAM 102, commencing at the first location and proceeding until the $n^{th}$ location is written. After each execution of step (14), step (15) is executed and a RO (read operation) is initiated to read whether a word of all zeros has been read into the previous storage location of the RAM 102 of FIG. 1 that had been written with all zeros.

At the completion of the last execution of step (15), it should be appreciated that n of the storage locations in the RAM 102 have now been read. At this time, the EF flag should be at a logic "1" or high level. Thus, if the EF flag has been set to a logic "0" or low level following the last execution of step (15), then the flag was set in error. Until the last execution of step (15), the FIFO 100 should not be empty because all of the n rows of the RAM 102 have not been read. Thus, EF flag should not be set to a logic "1" level prior to this time. Thus, a check on the status of the EF flag also occurs the repeated execution of step (14) as well.

MPFs and address faults AF-II and AF-IV, as well as faults associated with the Full FIFO (FF) flag, are detected upon execution of the steps (16)–(23). Step (16) is executed after the last execution of step (15), and upon execution of step (16), a RT operation is commenced to reset the RAR 114 of FIGS. 1 and 2 to the IA (initial address). Thereafter, steps (17) and (18) are executed in sequence n times. Upon each execution of step (17), a RO is commenced to read the stored word at a successive one of n storage locations in the RAM 102, commencing at the initial ($0^{th}$) location, while at the same time, the data input line DI is held to a logic "1" or high level. After each execution of step (17), step (18) is executed. Upon each execution of step (18), a WO (write operation) is commenced to write a word of all ones in a successive one of the storage locations in the RAM 102 previously read during step (17). After the last execution of step (18), the FF flag should now be set to a logic "1" or high level since the RAM 102 should now be full.

During each successive execution of step (17), a zero should be read at the corresponding storage location in the RAM 102 because of the previous WO executed during step (14). Thus, if a zero is not read during each execution of step (17), then a Stuck-At Fault (SAF) may have occurred. Also, after the last execution of step (17), the FIFO full flag FF should not be set since the FIFO 100 fully is not completely full because only n-1 locations were written with data. At this time the EF should also not be set since the FIFO 100 is not completely empty. However, after the last execution of step (18) there will have been n WOs so that the FF should now be at a logic "1" or high level. A type IV address fault may also manifest itself at this time Following the last execution of step (18), steps (19) and 20 are executed n times. During each execution of step (19), the data input line DI is held to a logic low or "0" level while a RO is commenced. The RO is performed during each successive execution of step (19) to read a successive one of n of the storage locations in the RAM 102 to determine if a word of all ones is present. Since a word of all ones was previously written into each successive storage location in the RAM 102 during step (18), a word of all ones should be read upon each successive execution of step (19). If not, then a MPF or SAF may have occurred. After each execution of step (19), step (20) is executed and a WO is commenced to write a word of all zeros into each a successive one of n locations in the RAM 102 to detect type IV address faults.

During steps (17) and (19), the Data Input (DI) line is held to a logic "1" and logic "0", respectively, while at the same time a RO is commenced to read a logic "0" and a logic "1", respectively, at each successive storage location in the RAM 102. If the logic vale on the DI line is read, rather than the true value in the storage location, then a MPF associated with the multiple accessing mechanism of that location has occurred.

Steps (17)–(20), when executed, serve to detect the presence of a type IV addressing fault (AF-IV). An AF-IV associated with the WAR 112 occurs when a word is written to both of a pair of storage locations i and j in the RAM 102 when an attempt is made to write to either of the locations i and j individually. In a similar fashion, an AF-IV associated with the RAR 114 occurs when word is read at both a pair of storage locations i and j in the RAM 102 when an attempt is made to read either of the locations i and j individually. To detect this type of addressing fault, a test that contains ↑(rx, wx̄) ↑(r̄x, wx) or ↑(rx/x̄ wx̄) ↑(r̄x/x, wx/x̄) is needed. It is this type of test that is performed upon execution of steps (17)–(20).

Following the last execution of step (20), step (21) is executed in succession n-1 times. During each successive execution of step (21) a RO is performed on a successive one of n-1 locations in the RAM 102 to read whether a word of all zeros had been written. If a word not containing all zeros is read during any execution of step (21), then a possible transition fault or a type II addressing fault may have occurred. Following step (21), step (22) is executed to commence a read operation to read a word of all zeros. Upon the execution of step (22), the EF flag should now be set because the all of the words stored in the RAM 102 should have been read.

Following the first execution of steps (14)–(22), the steps are executed again for each of several different data or background patterns in order to properly test for the presence of state coupling faults (CFst) that occur as the result of the bit in one storage location improperly influencing the value of the bit in an adjacent location. As discussed above, during the first execution of steps (14)–(22) a background pattern of all ones and zeros is written. Next, a background pattern of (0 0 0 0 1 1 1 1 . . . ) and its complement (1 1 1 1 0 0 0 0 . . . ) are written. Thereafter, a background pattern of (0 0 1 1 0 0 1 1 . . . ) and its compliment (1 1 0 0 1 1 0 0 . . . ) are written. This background pattern is followed by a pattern of (0 1 0 1 0 1 0 1 . . . ) and its complement of (1 0 1 0 1 0 1 0 . . . ). The number and constitution of the background patterns corresponds to the number of bits B in each row in the RAM 102. In practice, log (B)+1 separate patterns are needed to test for such state coupling faults. Thus when B equals eight, then four separate background patterns are necessary.

Steps (23)–(31) comprise the fourth operation sequence and are executed following step (22) to detect the following type of faults: AF-II, AF I, DRF and SOF as well as faults associated with the WAck signal and with the OWP feature of the FIFO 100. Step (23) is executed n-1 times after step

(22) to initiate a WO to alternately write words of all zeros and all ones into the RAM 102. For example, upon the first execution of step (23), a word of all zeros is written at the first ($0^{th}$) location in the RAM 102. Upon the next execution of step (23), a word of all ones is written at the second location and so on. Following step (23), step (24) is executed and a WO is initiated to write a word of all ones at the location n-1 in the RAM (102). Upon the execution of step (24), all of the n locations in the RAM 102 will have been written so that FF flag should now be set to a logic "1" or high level. If the flag has not been set, then a type I addressing fault (AF-I) has occurred.

After step (24), step (25) is executed whereupon the write clock (WCK) signal is asserted while the write enable (WE) line is also asserted. Under this condition, the OWP feature of the FIFO should be effective to prevent a write operation from occurring since the FF flag is now at a logic "1" or high level. If the WAck flag goes to a logic "1" or high level at this time, then a fault exits with either the OWP feature of the FIFO 100 and/or the WAck flag.

Following step (25), step (26) is executed, whereupon a delay state is entered so that no operation is executed. The purpose in entering a delay state during step (25) is to allow any potential data retention to manifest itself when data is subsequently read from and written to the RAM 102. Following step (26), then steps (27) and (28) are executed in sequence n times to read and write n successive storage locations in the RAM 102. During step (27) each successive location is read to determine if alternate storage locations contain all zeros and all ones. For example, during the first execution of step (27), the currently addressed storage location in the RAM 102 is read to determine if it contains all zeros. During the next successive execution of step (27), the next successive storage location in the RAM 102 is read to determine if a word of all ones is present and so on. The purpose in alternating writing words of ones and zeros into the RAM 102 is to determine whether the particular value written into a storage location has leaked so that upon a subsequent reading of that location, the previously written value is no longer present.

After each execution of step (27), step (28) is executed to alternately write words of all ones and all zeros into the RAM 102. Thus, after the first execution of step (28), a word of all ones is written into the currently addressed location in the RAM 102. Upon the next successive execution of step (28), a pattern of all zeros is written in the next successively addressed storage location and so on.

The read operation commenced each time step (27) is executed serves to detect the word written previously during each successive execution of step (23). A Stuck-Open Fault (SOF), occurring as a result of the inability of a storage location in the RAM 102 to reflect the value previously written therein, will manifest itself during the execution of step (27). Likewise, a data retention fault (DRF), occurring as a result of a leakage in one or more of the bits in a previously written word over time, may also manifest itself at this time.

Following step (28), another delay occurs during step (29). Thereafter, step (30) is executed successively n-1 times to read the RAM 102 to determine if each of n-1 successive locations in the RAM had been alternately written with words of all ones and all zeros as should be the case following the last successive execution of step (28). As during step (27), DRFs and SOFs will manifest themselves during step (30). Following step (30), a RO is executed during step (31) to determine if the currently addressed location in the RAM 102 contains a word of all zeros. When executed in this manner, steps (27), (30) and (31) will manifest all possible SOFs and DRFs.

As should be appreciated from the foregoing description, the steps (1)–(31), when executed in the manner described, serve to manifest the possible memory, address and functional faults of the FIFO 100. The method of testing, represented by steps (1)–(31) does not require any modifications to the design of the FIFO 100. However, there are aspects of the method of FIG. 2 which may be viewed as disadvantageous. For example, the steps (7)–(13) performed for detecting faults associated with the RS operation have a complexity (O) on the order of $O(n^2)$. Further, the steps (14)–(22) that are performed to detect state coupling faults (CFst) have a complexity of $O(n \log B)$. Further, the method of FIG. 3 is provides somewhat limited coverage of indepotent coupling faults CFid.

Figure 4:
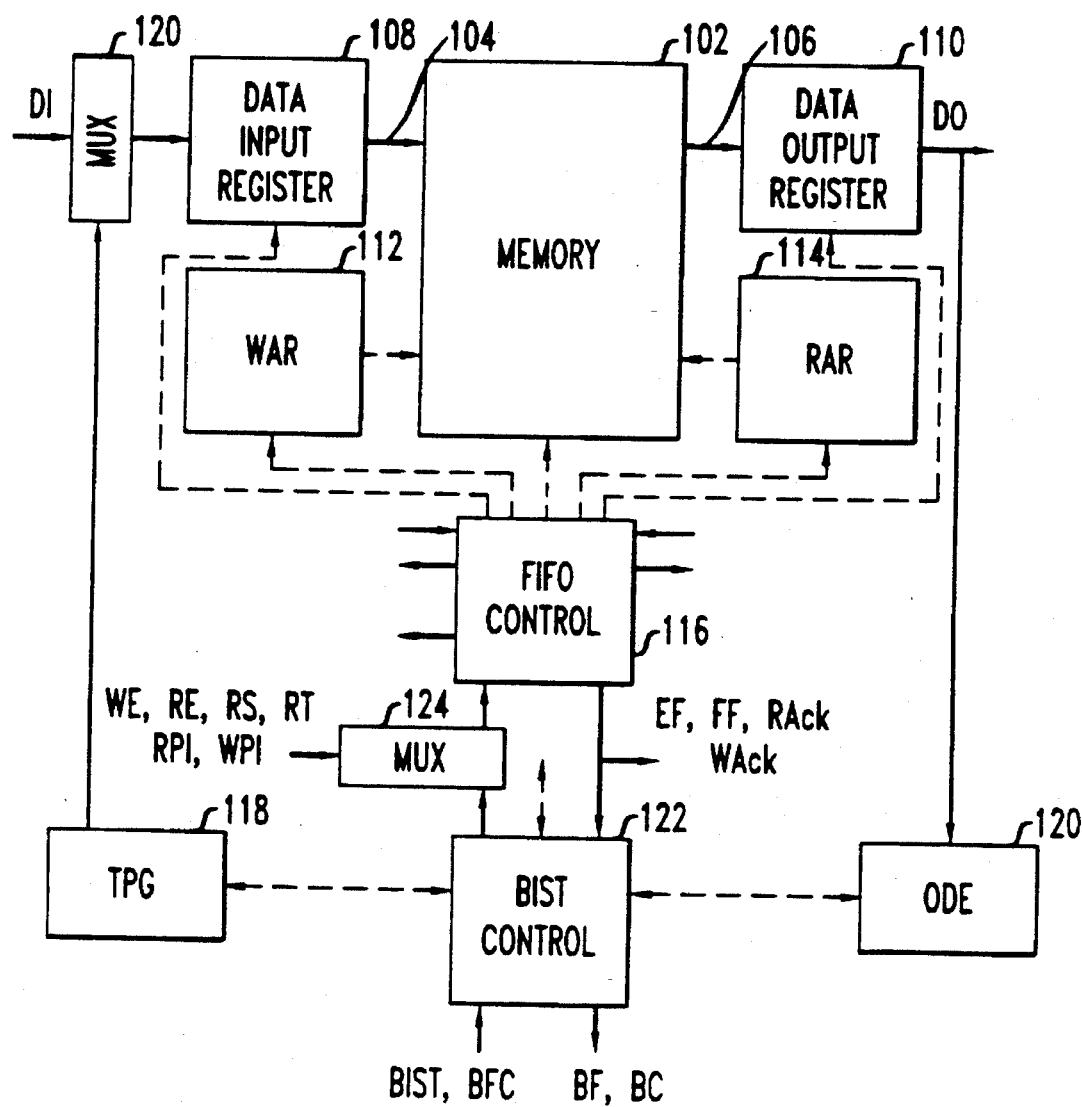
FIG. 4 is a block schematic diagram of a ring-address FIFO in accordance with another aspect of the invention.

If it is possible to alter the design of the FIFO 100, then a more streamlined test method can be provided. Referring to FIG. 4, there is shown alternate embodiment of a FIFO 100' especially designed for testability in accordance with the invention. The FIFO' 100 of FIG. 4 shares many elements in common with the FIFO 100 of FIG. 1 and therefore, like elements have been designated by like reference numbers. Thus, as compared to the FIFO 100 of FIG. 1, the FIFO 100' of FIG. 4 also includes a RAM 102, data input and output registers 108 and 110, respectively, Write Address and Read Address Registers (WAR) and (RAR) 112 and 114, respectively, as well as a FIFO control block 116, all functioning in the same manner as described previously.

To facilitate its testability, the FIFO 100' of FIG. 4 includes a Test Pattern Generator (TPG) 118 for generate test patterns, in the form of vectors, for input to the RAM 102. The test patterns from the TPG 118 are multiplexed by a multiplexer 120 with signals appearing on the data input line DI. During testing intervals, the multiplexer 120 passes test patterns from the TPG 118 to the data input register 108 for input to the RAM 102. During non-testing intervals, the multiplexer passes signals received on the DI line to the RAM 102.

To further facilitate testing, the FIFO 100' of FIG. 4 also includes an Output Data Evaluator (ODE) 120 coupled to the output of the Output Data Register 110 so as to receive the same data that is output to the Data Output line DO. In practice, the ODE 120 takes the form an AND and OR tree (not shown) for ANDing and ORing the data on the DO line to compact the output data from the Data Output Register 110 during test intervals. The output data compacted by the ODE 120 during test intervals takes the form of responses generated by the RAM 102 to the test patterns provided by the TPG 118.

Overall control of the TPG 118 and the ODE 120, as well as control of the FIFO control block 116 is provided by way of a Built-In Self-Test (BIST) control 122 that typically comprises a finite state machine (not shown). The control signals from the BIST control 122 are multiplexed by a multiplexer 124 with the signals WE, RE, RS and RT externally supplied to the FIFO block 1116 as described previously, and as a pair of control signals Write Pointer Inhibit (WPI) and Read Pointer Inhibit (RPI). The WPI and RPI control signals operate to inhibit the WAR 112 and RAR 114, respectively, from being imcremented after a WO and RO, respectively. The pointer inhibit function associated with each the WAR 112 and RAR 114 is provided for purposes of testability.

In addition to supplying control signals to control testing, the BIST control 122 is also responsive to the EF, FF, RAck and WAck flags generated by the FIFO control 116. In accordance with the EF, FF, RAck and WAck flags, the BIST control 122 operates to generate a pair of signals BIST Flag (BF) and BIST Complete (BC). The BF and BC flags may be accessed by an external test device (not shown) such as a personal computer, to determine the operating status of the FIFO 100'.

Referring to FIG. 5, there is shown in tabular form the steps of a method, in accordance with a second aspect of the invention, for testing the FIFO 100' of FIG. 1. Step (1') is the first step of the method illustrated in FIG. 5 and is executed to initiate an RS operation, thereby resetting both the WAR 112 and RAR 114 of FIG. 4. At this, FF=0 while EF=1 since the RAM 102 is empty. Step (2') is executed following step (1'), whereupon the Read Clock signal (RCK) is asserted at the same time the Read Enable (RE) signal is asserted at a logic "1" or high level to initiate a RO. If the FIFO 100' of FIG. 4 is operating properly, the Over Read Protection (ORP) feature of the FIFO should inhibit the RO since EF=1 at this time. Thus, the presence of a logic "1" or high level RAck flag at this time signifies that either this flag was improperly set, or that the ORP feature of the FIFO 100' is defective.

Step (3') is executed following step (2'), whereupon the Write Clock (WCK) is asserted at the same time the Write Enable (WE) signal is asserted at a logic "1" or high level. Since FF=0, a WO may occur. However, since no actual WO has taken place, the WAck should not be asserted. After step (3'), step (4') is executed and a WO is initiated to write a word of all zeros at the first location of the RAM 102 of FIG. 4. At this time, the WAck flag should be set. If not, then a fault has occurred.

Following step (4'), step (5) is executed, whereupon the RCK signal is asserted at the same time the RE signal is asserted at a logic "1" or high level to initiate a RO. Since a WO had occurred previously during step (4'), the EF flag should no longer be set. Thus, a RO may occur. However, since an actual RO has yet to occur, the RAck flag should not yet be set. Step (6') is executed after step (5') to initiate a RO to read if a word of all zeros is present at the currently addressed location of the RAM 102. Since a word of all zeros was previously written at that location during step (4'), such a word should be read during step (6'). The ability to correctly read a word of all zeros during step (6') verifies the ability to execute a WO followed by a RO. Also at this time, the flag RAck should also be set since a RO occurred during step (6'). Steps (1')–(6') correspond to steps (1)–(6) of FIG. 2 are executed to detect the same type of faults.

Step (7') follows step (6'). During step (7'), a RT operation is initiated to reset the RAR 114 of FIG. 4 in the same manner as step (7) of FIG. 2. Next, step (8') is executed, whereupon a Serial Loading Operation is initiated to load a value of zero in the initial address (IA) position in both the WAR 112 and the RAR 114 and ones in the other positions. During execution of the SLO, the n-bit circular loop associated with each of the WAR 112 and RAR 114 is broken, allowing each register to be scanned by n operations. In this way, the reset function of the FIFO 100' of FIG. 4 can be tested by initiating a single RS operation during step (9'), thereby reducing the complexity of the operation associated with detecting faults associated with the RS operation. If the RS operation has been successfully performed during step (9'), then the EF flag, which was unset during step (7'), should now be set. The failure of the EF flag to be set at this time signals a fault associated with the RS operation.

Following step (9'), a modified "march" algorithm is executed to test for faults associated with the EF and FF flags as well as various memory and addressing faults. The modified march algorithm is initiated upon execution of step (10'), whereupon a WO is executed n times to write a word of all zeros in each successive location in the RAM 102. Having now written the RAM 102 with data, the EF flag should not be set to a logic "1" or high level. After each execution of step (10'), step (11') is executed and a RO is initiated to successively read each of the n locations previously written with all zeros. (Thus steps (10') and (11') are both executed n times.) If the RO performed during each execution of step (11') was successful, then the EF flag should be asserted after the last execution of step (11') because all of the locations in the RAM 102 that were previously written have now been read, rendering the RAM empty (i.e., completely read).

After the last execution of step (11'), step (12') is executed and a RT operation is performed to reset the RAR 114. Next, step (13') is executed n times to perform a sequence of read and write operations. During each execution of step (13'), the DI line is held to a logic "1" or high level while a RO is initiated to read if a word of all zeros is present at a successive one of n-1 storage locations in the RAM 102. After the RO, a pair of Write Inhibit (wi) operations are commenced in succession to write a B bit word into the RAM 102 without incrementing the WAR 112. During the first wi, a word of all ones is written, whereupon a word of all zeros is written during the second wi. After the second wi, a WO is commenced word of all ones is written in the RAM 102. Thus, during each successive execution of step (13'), an RO and three WOs are executed in succession. Stuck-at faults (SAFs), Multiport Faults (MPFs), Linking Faults (LFs) as well as Read Inhibit (RI), and Write Inhibit (WI) faults will manifest themselves during step (13').

Following step (13'), step (14') is executed n times. During each execution of step (14'), a Read Inhibit (ri) operation, a wi operation, an RO and a WO are performed in sequence. During the ri, a B-bit word is read from the RAM 102 at the currently addressed location, without incrementing the RAR 114 of FIG. 4, to determine if the word is all ones. During the wi executed next, a word of all zeros is written into the currently-addressed location in the RAM 102 without incrementing the WAR 112 of FIG. 4. During the RO executed after the wi, the currently addressed location in the RAM 102 is read to establish whether a word of all zeros is present. However, unlike the previous ri operation, during the RO, the RAR 114 of FIG. 4 is incremented. Following the RO, a WO is initiated to write a word of all ones. When this WO is executed, the WAR 112 of FIG. 4 is incremented. Upon the last execution of step (14'), type IV address faults, Transition Faults (TFs), and faults associated with the wi and ri operations and with the FF will manifest themselves.

After step (14'), step (15') is executed n times. During each execution of step (15'), the DI line is held to a logic "0" or low level while a first Write Inhibit (wi) operation is commenced to write a word of all zeros into the RAM 102 without incrementing the WAR 112 of FIG. 4. Following the first wi, a second wi is commenced to write a word of all ones, again without incrementing the WAR 112 of FIG. 4. After the second wi, a WO is commenced to write a word of all ones is written in the RAM 102. After upon the execution of the WO, the WAR 114 of FIG. 4 is incremented Thus, during each successive execution of step (15'), two wi operations are executed in succession followed by a WO. At the end of the last execution of step (15'), Stuck-at faults (SAFs), Multiport Faults (MPFs), Linking Faults (LFs) as well as type I addressing faults will manifest themselves.

The WAR 112 and the RAR 114 are inhibited from being incremented in the manner described above to permit that complete detection of indepotent coupling faults (CFids) that require that the FIFO 100 execute at least three separate read and write operations, such as $\Uparrow r^0 w^1 w^0$, at each storage location, or two operations with reverse address direction, such as $\Downarrow r^1 w^0 \Uparrow R^0$. A conventional FIFO, such as the FIFO 100 of FIG. 1, is incapable of executing three or more read and write operations at the same storage location and is also incapable of performing inverse addressing operations. However, by inhibiting the WAR 112 and the RAR 114 by inhibit operation described above, then three or more read and write operations can be executed at the same address, thus permitting complete detection of CFids. Further, the above-described inhibit operation can be employed to manifest Linking Faults (LFs) which require four read and write operations at each address.

Following the last execution of step (15'), step (16') is executed n times. During each execution of step (16') a ri operation, a wi operation, a RO and a WO are performed in sequence. During the ri, a word is read from the RAM 102 at the currently addressed location, without incrementing the RAR 114 of FIG. 4, to determine if the word is all zeros. During the wi executed next, a word of all ones is written into the currently-addressed location in the RAM 102 without incrementing the WAR 112 of FIG. 4. During the RO executed after the ri, the currently addressed location in the RAM 102 is read to establish whether a word of all ones is present. However, unlike the ri operation, during each RO, the RAR 114 of FIG. 4 is incremented. Following the RO, a WO is initiated to write a word of all zeros. When this WO is executed, the WAR 112 of FIG. 4 is incremented. Upon the last execution of step (16'), type I and IV address faults, TFs will manifest themselves as well as faults associated with the FF.

After the last execution of step (16'), step (17') is executed B times during which a wi is executed to write a walking zeros pattern without incrementing the WAR 112 of FIG. 4. After each wi, a ri is executed to read whether a walking zeros pattern was indeed written. After the last execution of step (17'), step (18') is executed B times during which a wi and a ri are executed in succession to write a walking ones pattern and then to read the walking ones pattern just written, respectively. Steps (17') and (18') collectively serve to manifest Programmable Space Compaction Faults (PSCFs) associated with the compaction provided by the ODE 120 of FIG. 4.

After the last execution of step (18'), step (19') is executed and the WCK signal is asserted while maintaining the WE signal at a logic "1" or high level to attempt a WO. However, at this time, the FF should be at a logic high or "1", thus precluding a WO if the OWP feature of the FIFO 100 is operational. Thus, by monitoring the status of the WAck flag during step (19'), a fault with this flag, and/or with the OWP feature of the FIFO 100, can be detected.

Step (20') is executed next, whereupon a delay occurs. Following step (20'), step (21') is executed n times. During each execution of step (20'), a RO is performed to read whether a word of all zeros is present at each successive location in the RAM 102 of FIG. 4. At the end of step (21'), type II address faults will manifest themselves. Following step (21'), step (22') is executed n-1 times to write a word of all ones. Step (21') serve to manifest DRFs by detecting for retention of words of all zeros.

Step (23') is executed after step (22'). During step (23'), a WO is executed to write a word of all ones in the currently addressed location in the RAM 102. Thereafter, step (24') is executed, whereupon another delay occurs in order to detect for data retention faults occurring because of complementary values (all ones). Finally, step (25') is executed n times. During each execution of step (25'), a RO is performed to read whether a word of all ones is present at each successively addressed location in the RAM 102 of FIG. 4. DRFs that have not previously manifested themselves will do so during step 25' because at this time, an examination is made whether words of all ones have been retained.

The foregoing describes a method for testing a dual-port, RAM-Type ring-address FIFO 100 to test for memory, address and functional faults.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for testing a dual-port, RAM-type ring-address FIFO having a write address and read address registers, comprising the steps of:

executing a first sequence of operations, including a first set of functional operations and a first read and a first write operation, to detect a first set of functional faults in the FIFO, including faults associated with the ability of the FIFO to read data when none is present in the FIFO, and the ability of the FIFO to acknowledge the occurrence of a read and write operation;

executing a second sequence of operations, including a re-transmit and reset operations to reset both the write and read address registers simultaneously, and to rest the read address register alone, respectively, to detect a second set of functional faults associated with the ability of the write address and read address registers to be reset;

executing a third sequence of operations, including second write and read operations, and at least a second functional operation, to detect a third set of functional faults, a first set of memory faults, and a first set of address faults; and executing a fourth sequence of operations, including third read and write operations, and a third functional operation, to detect a second set of addressing faults, a second set of memory faults and a fourth set of functional faults.

2. The method according to claim 1 wherein the first functional operations include a reset operation and a re-transmit operation.

3. The method according to claim 1 wherein the first sequence of operations includes at least one functional operation during which a read clock signal at a prescribed level is supplied to the FIFO while a read enable signal at a first prescribed is also supplied for the purpose of testing the ability of the FIFO to execute a read operation when the FIFO is empty.

4. The method according to claim 1 wherein the first sequence of operations includes a functional operation during which a write clock signal at a first prescribed level is supplied to the FIFO which a write enable signal at a prescribed level is also supplied to determine whether the FIFO is capable of executing a write operation when the FIFO is not full.

5. The method according to claim 1 wherein the second sequence of operations detects faults associated with a re-transmit and reset functionality of the FIFO.

6. The method according to claim 1 wherein the second sequence of operations includes a serial loading operation during which each of the read address and write address registers are loaded with data.

7. The method according to claim 1 wherein second read and write operations of the third sequence of operations are executed in sequence a plurality of times to ascertain whether the FIFO can accurately indicate when it is empty.

8. The method according to claim 1 wherein the third sequence of operations includes fourth read operation and fifth write operation which are executed in sequence a plurality of times to ascertain whether the FIFO can accurately indicate when it is full..

9. The method according to claim 1 wherein the third sequence of operations includes at least one read inhibit operation during which the FIFO is read without incrementing the read address register and at least one write inhibit operation during which the FIFO is written without incrementing the write address register.

10. The method according to claim 1 wherein the fourth sequence of operations includes at least one delay interval between read and write operations.

11. The method according to claim 1 wherein the fourth sequence of operations includes two delay intervals, each delay interval occurring between a write and read operations.

12. A method for testing a dual-port, RAM-type FIFO having a built-in test pattern generator and a built-in output data evaluator, as well as a built-in test controller for controlling the test pattern generator and the output data evaluator, comprising the steps of:

executing a first sequence of operations, including a set of functional operations, a first write operation, and a first read operation, to test the ability of the FIFO to read and write data;

executing a second sequence of operations, including a re-transmit operation, to test the ability of the FIFO to reset itself;

executing a third sequence of operations, including a sequence of read inhibit and write inhibit operations during which a single location in the FIFO written at least twice prior to writing to another location, to perform a modified march test on the FIFO to detect memory and address faults;

executing a fourth sequence of operations to detect faults associated with the output data evaluator; and executing a fifth sequence of operations, including a delay interval, to detect data retention faults.

* * * * *